United States Patent [19]
Yin et al.

[11] Patent Number: 5,865,901
[45] Date of Patent: Feb. 2, 1999

[54] WAFER SURFACE CLEANING APPARATUS AND METHOD

[75] Inventors: Xiaoming Yin, Wappingers Falls; Xian J. Ning, Mohegan Lake, both of N.Y.

[73] Assignee: Siemens Aktiengesellschaft, Munich, Germany

[21] Appl. No.: 998,857

[22] Filed: Dec. 29, 1997

[51] Int. Cl.⁶ .................................................. C03C 19/00
[52] U.S. Cl. ................. 134/2; 134/6; 134/7; 134/18; 134/32; 134/42; 134/57 R; 134/902; 451/6; 451/38; 451/39; 451/75; 451/78
[58] Field of Search ............................. 41/6, 38, 39, 75, 41/78; 134/2, 6, 7, 18, 32, 42, 57 R, 902

[56] References Cited

U.S. PATENT DOCUMENTS

| | | | |
|---|---|---|---|
| 3,691,695 | 9/1972 | Green et al. | 51/8 |
| 3,702,042 | 11/1972 | Cochran et al. | 451/78 |
| 5,032,217 | 7/1991 | Tanaka | 134/902 |
| 5,364,472 | 11/1994 | Heyns et al. | 451/39 |
| 5,433,650 | 7/1995 | Winebarger | 451/39 |
| 5,663,797 | 9/1997 | Sandhu | 451/6 |
| 5,703,642 | 3/1998 | Sandhu et al. | 451/6 |

*Primary Examiner*—Jill Warden
*Assistant Examiner*—Sharidan Carrillo
*Attorney, Agent, or Firm*—Stanton C. Braden

[57] ABSTRACT

A substrate cleaning assembly (10) and method for removing contaminant substances (11) from a surface (12) of a substrate (13) employed in microelectronics manufacturing. The cleaning assembly (10) includes a substance locator (15) adapted to locate and map at least one contaminant substance (11) on the surface (12) of the substrate (13) and a dispenser (16) formed and dimensioned to accurately dispense a substantially controlled, impinging stream (17) of cleaning agent along a path (18). A controller (20) is coupled to the map device (15) and the dispenser (16), and is adapted to control the impinging stream (17) such that the located contaminant substance (11) is positioned in the path (18) of the impinging stream (17) to enable substantially localized impingement and removal of the substance (11) from the substrate surface (12).

25 Claims, 2 Drawing Sheets

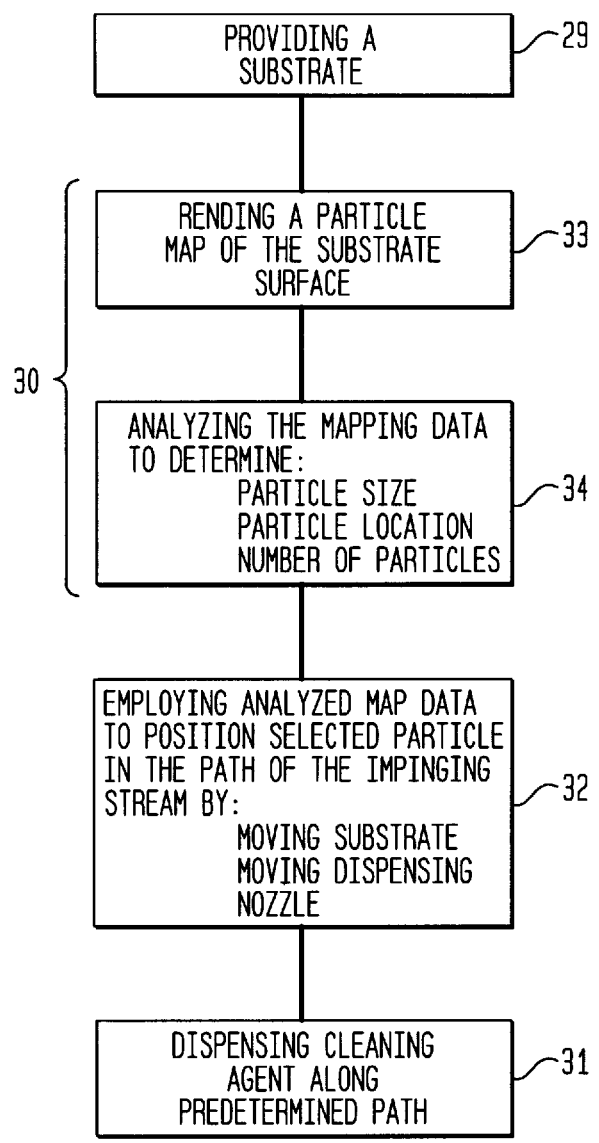

WAFER SURFACE CLEANING APPARATUS AND METHOD

TECHNICAL FIELD

This present invention relates, generally, to surface cleansing assemblies, and, more particularly, relates to sensitive microelectronic surface cleansing assemblies using particle location map information for localized cleansing.

BACKGROUND ART

The continued trend in the electronics industry, as technology advances, is toward increased circuit densities motivated by the need for smaller, thinner integrated circuit (IC) packages. As a result, the fabrication of these IC packages becomes increasingly difficult due to the decreased spacing between adjacent circuits. Commensurate with this size reduction, various process limitations have made IC fabrication more difficult. For example, the presence or generation of undesirable contamination particles (such as dust particles or moisture droplets as small as 0.10 micrometers and above) during the manufacturing and processing of integrated circuits can often cause physical defects or other quality control problems. Such failures are responsible for significant yield reductions in the microelectronics industry. This is especially problemsome in semiconductor manufacture, for example, where semiconductor wafer processing geometries can approach 0.1 micrometer ($\mu$m) and below with line widths of 0.35 $\mu$m.

IC or microelectronic circuit fabrication requires many processing steps generally all of which must be performed under extremely clean conditions. However, the amount of contamination needed to produce fatal defects in microcircuits is extremely small, and may occur at any time during the many steps needed to complete the circuit. Therefore, during fabrication, periodic cleaning of the wafers is necessary to maintain economical production yields.

At least three conventional techniques are presently employed to clean substrate surfaces for the electronics industry (i.e., wet-clean, gas or liquid jet stream-clean and aerosol-clean). Depending upon the size of the particles to be removed, certain techniques may be more efficient than others. For instance, as will be described below, contaminant particles having diameters greater than about 50,000 Angstroms (Å) may be more suitable for the momentum transfer techniques from impinging gases, fluids or solids employed in the jet stream and aerosol techniques. For particles smaller than about 50,000 Å the chemical or solvent solution techniques of wet cleaning may be more effective. Moreover, chemically bound contaminant particles have higher adhesion energies, comparable to binding energies of solids. They are difficult to dislodge by most cleaning techniques and may need to be sputtered away or dissolved using the wet clean technique. The physically bound contaminant particles, in general, can be dislodged by momentum transfer from impinging gases, fluids or solids, a concept used in spray, ultrasonic and aerosol cleaning.

Briefly, the wet-clean technique, also known as solvent or chemical cleaning, is commonly performed by submerging the entire substrate (e.g., a wafer or flat panel) in a solvent or chemical bath to remove contaminant films from the surfaces. Since solvents are selective in the materials they can dissolve, an appropriate solvent must be chosen to remove the targeted contamination. Chemical solutions may also be combined with Megasonic or Ultrasonic cleaners which generate high energy sonic waves to remove organic films, ionic impurities and particles as small as about 3000 Å.

One problem associated with this technique is that the agents used in solvent or chemical solution must be extremely pure and clean which is difficult and/or expensive to achieve. In addition, as the agent is used, it becomes progressively more contaminated and, thus, must be disposed of periodically. Failure to periodically change the agent causes redeposition of contaminants, which reduces the effectiveness of the cleaning process. Further, regardless of the locality, quantity and/or density of the particle contamination on the substrate surface, the entire wafer must be submerged to enable removal of the contamination. Accordingly, in instances where the bath solution is relatively dirty, the substrate surface may emerge with more trace contaminants than before the wet clean.

As above-indicated, the next two methods employ momentum transfer techniques as a means to dislodge the contaminant particles from the substrate surface. Gas or liquid jet spray cleaning, for example, employs pressurized freon, filtered nitrogen or de-ionized water, respectively, to spray the substrate surface at predetermined angles. Gas jet cleaning is presently used to clean relatively large particles from silicon wafers, and is generally ineffective in removing particles smaller than about 50,000 Å. Removal of smaller particles is usually more problematic since the adhesive force tending to hold the particle to the surface is proportional to the particle diameter while the aerodynamic drag force by the particles tending to remove the particle are proportional to the diameter squared. Therefore, the ratio of these forces tends to favor adhesion as the particle size shrinks. Also, smaller particles are not exposed to strong drag forces in the jet since they can lie within the surface boundary layer where the gas velocity is low. Liquid jets, in contrast, provide stronger shear forces to remove particles but are expensive and/or difficult to obtain at high purity and may leave contaminant residues after drying.

Cryogenic aerosol cleaning, on the other hand, uses pressurized liquid carbon dioxide, nitrogen or argon to, in effect, "sandblast" the contaminant surfaces. As the expanding gas exits the nozzle and drops to atmospheric pressure, the resulting cooling forms solid particles (e.g., solid carbon dioxide) which traverse the surface boundary layer at predetermined angles. The frozen particles are capable of penetrating through the surface boundary layer of the substrate, and impinge on the contaminant particle and overcome its adhesion force. Typical of these patented cryogenic aerosol cleaning assemblies may be found in U.S. Pat. Nos.: 5,372,652; 5,147,466; 5,062,898; 5,035,750; 4,974,375; 4,806,171; 4,747,421 and 4,617,064.

While the jet stream clean and the aerosol clean methods are advantageous for the most part, several problems are inherent. Both techniques, for example, spray or bombard the entire substrate surface at constant, high impacting velocities to overcome the adhesion forces of the contaminant particle, regardless of the location, size and number (i.e., density) of the particles. Thus, while the greater spray and aerosol velocities are necessary to dislodge the smaller particles, such velocities are not necessary for removal of the larger more easily removed contaminant particles. Further, the jet spray or aerosol spray is indiscriminately passed back and forth linearly across the entire substrate surface to sweep the contaminant particles from one end of the substrate to the other end thereof. This process is not only time consuming, but when combined with the high flow rates and the required high or ultrahigh purity solutions, the cleaning costs substantially escalate.

More importantly, such high impacting velocities and indiscriminant cleansing of the entire substrate surface unnecessarily exposes and subjects the sensitive microelectronics and other already clean areas to potential damage. This is especially true with aerosol cleaning where the solid particles in the high pressure aerosol are ejected at constant velocities near the speed of sound whereby the momentum transfer between the aerosol particles and the contaminant particles are completed with in a fraction of a second. Hence, substantial momentary forces are not only impressed upon the contaminant particle, but also upon the substrate surface and microelectronics as well. Surfaces which do not require cleaning are nonetheless exposed to potential and unnecessary microelectronic damage as well as potential pitting.

Conversely, in other instances of the prior art techniques, cleaning of the substrate surface may not optimized. This is due in part to the fact that contaminant areas of the substrate surface having more densely populated and/or smaller contaminant particulates may require a higher output pressure of the impinging jet stream or aerosol stream than that of the substantially constant, predetermined set pressure. In this situation, such contaminant particulates may not be effectively removed from the substrate surface during the cleaning process due to the inadequate impinging pressure of the cleaning agent.

SUMMARY OF INVENTION

The present invention provides a substrate cleaning assembly for removing contaminant substances from a surface of a substrate employed in microelectronics manufacturing. Briefly, the cleaning assembly includes a substance location map device adapted to locate and map at least one contaminant substance on the surface of the substrate and a dispensing apparatus formed and dimensioned to dispense a substantially controlled, impinging stream of cleaning agent along a path. A controller device is further included coupled to the map device and the dispensing apparatus, and is adapted to control the impinging stream such that the located contaminant substance is positioned in the path of the impinging stream. This arrangement enables substantially localized impingement and removal of the substance from the surface of the substrate.

The location map device is further adapted to locate, map and numerically designate substantially all of the contaminant substances, such as particles and films, on the surface of the substrate. The controller device may then selectively position one of the impinging stream and at least one selected contaminant substance on the surface in the path of the impinging stream. Hence, substantially localized impingement of the immediate surrounding area of the contaminant substance is provided for removal thereof from the surface.

The location map device may further be adapted to determine the relative size and dimension of each of the contaminant substances. In this manner, an output controller of the dispensing apparatus may adjust the impinging stream, based on the relative size and dimension of the particular substance, to enable more efficient removal thereof.

For example, the output controller may control the output velocity and pressure of the gaseous stream in the dispensing nozzle. In other instances, the output diameter of the stream may be controlled, as well as adjusting the angle of impingement by the stream against the contaminant substance. The output may also include a pulsating action to facilitate localized removal of the contaminant substance.

In another aspect of the present invention, a method of removing contaminant substances from a surface of a substrate is provided for microelectronics fabrication. The contaminant removal method includes the steps of: locating and mapping at least one contaminant substance positioned on and relative to the surface of the substrate; and dispensing a cleaning agent in a substantially accurate and controlled impinging stream along a path. The next step includes positioning one of the impinging stream and the at least one contaminant substance in the path of the impinging stream to enable substantially precise, localized impingement and removal of the substance from the surface.

The locating and mapping step further includes the step of locating and mapping substantially all contaminant substances on the surface of the substrate; and the positioning step further includes the step of selectively positioning at least one selected contaminant substance in the path of the impinging stream to enable substantially precise, localized impingement of the immediate surrounding area of the contaminant substance for removal thereof from the surface. In another aspect of the present invention method, the locating and mapping step includes determining the relative size and dimension of each detected contaminant substance. Based upon this information, the method further includes the step of adjusting the impinging stream in a manner enabling removal of the selected contaminant substance.

BRIEF DESCRIPTION OF THE DRAWINGS

The assembly of the present invention has other objects and features of advantage which will be more readily apparent from the following description and the appended claims, when taken in conjunction with the accompanying drawing, in which:

FIG. 3 is a schematic representation of the present inventive method for cleaning a substrate employed in microelectronics manufacturing.

DESCRIPTION OF THE INVENTION

Figure 1:
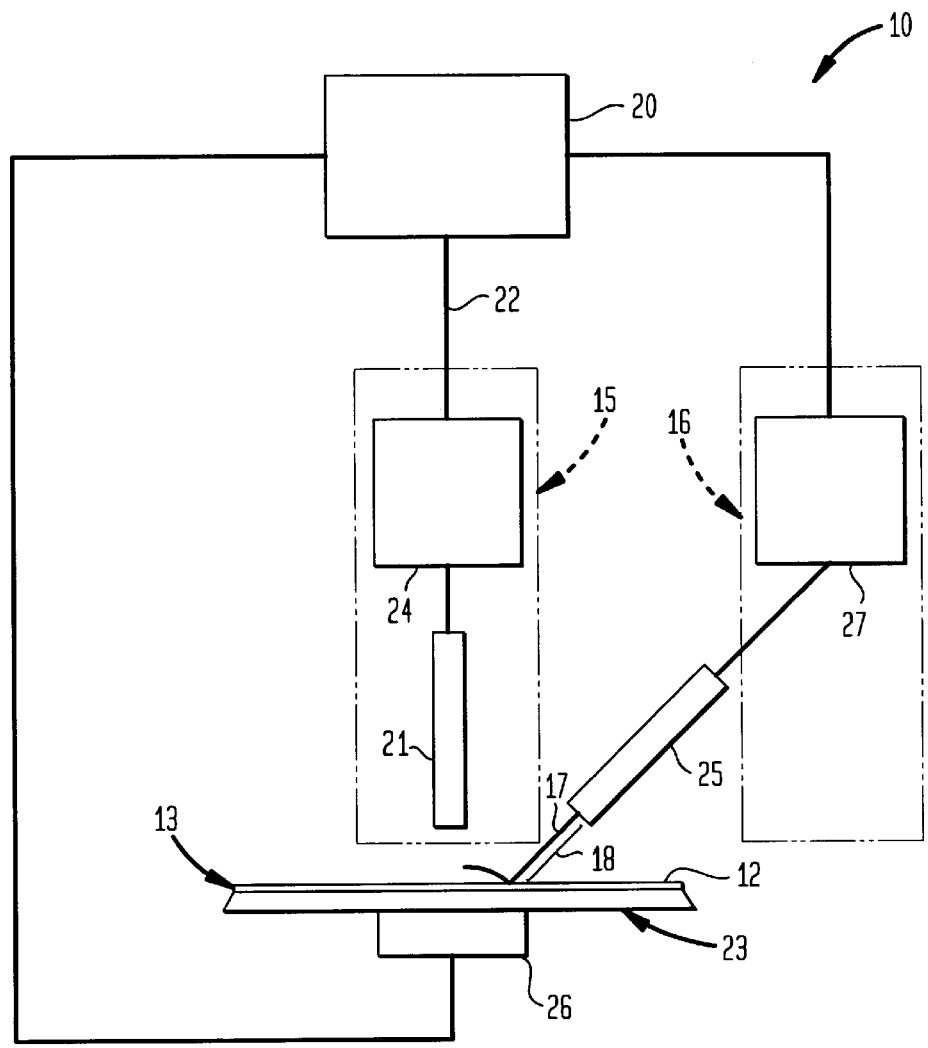
FIG. 1 is a schematic representation of a substrate cleaning assembly constructed in accordance with the present invention.

While the present invention will be described with reference to a few specific embodiments, the description is illustrative of the invention and is not to be construed as limiting the invention. Various modifications to the present invention can be made to the illustrative embodiments by those skilled in the art without departing from the true spirit and scope of the invention as defined by the appended claims. It will be noted here that for a better understanding, like components are designated by like reference numerals throughout the various figures.

Figure 2:
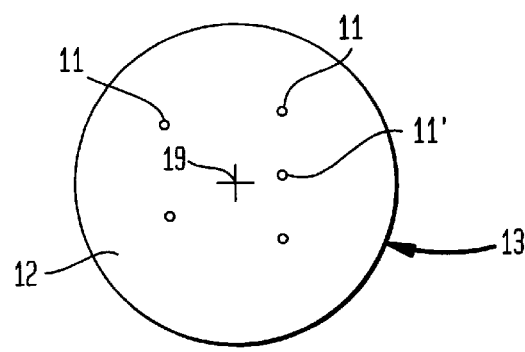
FIG. 2 is a schematic representation of a particle location map of the wafer surface generated by a mapping device of the present invention.

Attention is now directed to FIGS. 1 and 2 where a substrate cleaning assembly, generally designated 10, is illustrated for removing contaminant substances 11, 11' from a surface 12 of a substrate 13 such as a semiconductor wafer employed in microelectronics manufacturing. For example, the substrate is used in the manufacturing of semiconductor devices or integrated circuits (ICs). The ICs, for example, include memory circuits such as random access memories (RAMs), dynamic RAMs (DRAMs), synchronous DRAMs (SDRAMs), static RAMs (SRAMs), or read only memories (ROMs). Also, the ICs may be logic devices such as programmable logic arrays (PLAs), application specific ICs (ASICs), merged DRAM-logic ICs (embedded DRAMs), or any other circuit device. The ICs are used in, for example, consumer electronic products such as computer systems, office equipment including copiers and printers, cellular phones, personal digital assistants (PDAs), and other electronic products.

Briefly, the cleaning assembly 10 includes a substance location map device, generally designated 15, adapted to locate and map at least one contaminant substance 11' on the surface 12 of the substrate 13, if any, and a dispensing apparatus 16 formed and dimensioned to accurately dispense a substantially controlled, impinging stream 17 of cleaning agent along a path 18. A central controller device, generally designated 20, is further included coupled to the map device 15 and the dispensing apparatus 16, and is adapted to control the impinging stream 17 such that the located contaminant substance 11' is positioned in the path 18 of the impinging stream 17. This arrangement enables substantially localized impingement and removal of the substance from the surface of the substrate.

Accordingly, the substrate cleaning assembly of the present invention incorporates wafer particle location map information to locate at least one contaminant substance on the surface of the substrate. With this location map information, in combination with an accurate dispension of the impinging stream (either gas, liquid, solid particles or a combination thereof) along the path, the substrate cleaning assembly can be utilized to essentially "spot" or "selectively" clean pertinent portions of the substrate surface where such cleaning is necessary and which may affect the yield impact. This selective and localized cleaning technique, as compared to the indiscriminate cleaning techniques of the prior art assemblies, minimizes cleaning induced damage to the substrate surface caused by the impinging stream against the substrate surface. For instance, potential cleaning induced damage to the microelectronic circuits caused by either a jet stream clean technique or the aerosol clean technique may be avoided in the areas of the substrate surface which do not require cleaning. Further, potential pitting damage to a bare silicon substrate surface, caused by aerosol cleaning, may also be substantially reduced in areas which do not need to be cleaned.

Moreover, as will be described in greater detail below, in addition to the particle location information, the map device of the present invention is capable of determining the quantity of contaminant particles, as well as the estimation of the relative size and dimension of each particle. Use of this information enables the customization of the output of the impinging stream from the dispensing apparatus, such as the output pressure, stream diameter or impingement angle, for the most efficient and localized removal of the analyzed contaminant substance.

Finally, due to the selective region cleaning capabilities of the present invention, waste of the costly cleaning agents can be reduced since only the required regions will be cleaned.

Briefly, it will be appreciated that the term "contaminant substance" will be defined as any contaminant particle, film or the like which may be removed from the substrate surface using conventional jet stream clean or aerosol cleaning techniques. For ease of description, however, the term "contaminant particle" may also be used synonymously throughout the specification. Furthermore, the term "substrate" will be defined as any blank or patterned wafer, photolithographic mask, or flat panel device employed in the manufacture of microelectronic devices. The substrate surface, hence, can be essentially any surface of a particular layer of the microelectronic device during fabrication and cleaning.

As shown in FIGS. 1 and 2, map device 15 includes a scanning or inspection device 21 configured to optically or electronically scan the substrate surface 12 of the substrate 13. Through the use of suitable software or the like, this data may be utilized to determine the number of contaminant particles detected on the surface of the substrate. Further, the map device 15 is capable of estimating the relative size and dimension of each detected contaminant particle as well as the location of the particles on the surface of the substrate. For example, the x, y coordinates of each contaminant particle may be calculated relative to a predefined reference notch or mark 19 on the wafer 13 (shown in the particle location map of FIG. 2).

Typical of these inspection devices 21 include optical or scanning electron microscope (SEM) instruments which are generally employed for quality control purposes. Such inspection instruments are designed to scan and inspect the surface of the substrate to monitor the quality of the etching and deposition processes during various stages of wafer fabrication. These inspection devices include those provided by KLA/Tencor Corp. (e.g., models 7700, 6420 or AIT) of Milpitas, Calif.; Orbot Corp. (e.g., models WF 720) which is a subsidiary of Applied Material of Santa Clara, Calif.; and by A.D.E. Corp. (e.g., models WIS 81 or WIS 82) of Boston, Mass.

Once the inspection device 21 has properly inspected the substrate surface 12 for contaminant particles (i.e., read the particle map of the substrate surface), conventional mapping circuitry or software 24 of the map device 15 analyzes the data to determine the number of particles on the substrate surface, the relative location of the particles and the size dimension of the particles. In essence, a particle location map is generated by the mapping device, as shown in FIG. 2. This mapping software may also be applied to determine whether the threshold number for particle contamination has been surpassed or whether the allowable number of surface contaminants are within the standard tolerance. The threshold number is, for example, defined by the user and such number may vary for different applications. Such number may be optimized by using historical information.

A data bus 22 communicates the analyzed particle map information between the map device 15 and the controller device 20. Responsive to this output data, the central controller device 20 controls for operation of the dispensing apparatus and the relative wafer movement therebetween to position the selected contaminant particle 11' in the path 18 of the impinging stream 17 of cleaning agent.

A substrate holder device 23 is provided to mount and position the substrate relative the dispensing apparatus 16. A variety of conventional substrate holders may be utilized including mechanical clamps, vacuum clamps, electrostatic chucks or the like. In the preferred form, the substrate holder 23 is formed to move the substrate 13 relative a dispensing nozzle 25 of the dispensing apparatus 16 for positioning of the selected region of the substrate surface into the path of the impinging stream expelled from the nozzle 25. While the substrate 13 is preferably moved relative this dispensing nozzle 25, it will be appreciated that the relative movement of the dispensing nozzle 25 may also be provided, or a combination thereof, without departing from the true spirit and nature of the present invention.

This computer controlled movement is preferably performed in the two axes containing the plane of the substrate surface, and are preferably operated through control circuitry 26 of the substrate holder device 23 which in turn is preferably controlled by central controller device 20. This control circuitry 26 typically operates precision motors (not shown) for programmed movement directly or indirectly using gears, belts or the like. Hence, once the detection of the contaminant particle and the relative location have been determined, through map device 15, the data may be passed through data bus 22 to controller device 20. If the mapped contaminant particle 11' is determined detrimental to the subsequent fabrication of the wafer, the controller device 20 commands the holder control circuitry 26 to move the substrate holder 23 (via control circuitry 26) such that the contaminant particle 11', located on substrate surface 12, is moved into the path 18 of the dispensed stream from dispensing nozzle 25. Upon operation of the dispensing apparatus 16, the selected contaminant particle or particles will be selectively and locally removed from the substrate surface without requiring indiscriminant cleaning of the entire substrate surface.

As set forth above, this technique reduces potential cleaning induced damage to either the microelectronics or the bare silicon surface as well as reducing waste of the expensive cleaning agent. Moreover, should the contaminant particle be detected in a region of the substrate which would not affect the overall yield impact, than such a particle would pose not reliability problems and may be left undisturbed on the substrate surface.

The present invention is also substantially suitable for cleaning particle inspection failed rework wafers where a "lot"(about twenty-five) of wafers, after initial random inspection, have been determined to fail the acceptable contaminant particle tolerance. In this situation, the present invention may be employed to locally clean some or all of the wafers only at the respective specific regions where the contaminant particles may be more densely populated thereon. Such "spot" cleaning may be sufficient to bring the whole "lot" within threshold tolerance without requiring indiscriminant cleaning of entire surfaces of some or all of the "lot" of wafers.

In accordance with the present invention, the dispensing apparatus 16 may be provided by either conventional gas jet cleaning, liquid spray cleaning or aerosol cleaning assemblies applied in the field. The dispensing nozzle 25 of these devices are capable of delivering substantially accurate impinging streams of cleaning agent along the predetermined path 18. Moreover, these dispensing devices are capable of delivering the impinging stream 17 generally on demand so that the delivery action can accurately start and stop.

Typical of these conventional gas jet cleaning or liquid spray cleaning dispensing assemblies may be provided by FSI International, Inc., Chaska, Minn., while suitable jet aerosol cleansing dispensing assemblies may be provided by FSI International, Inc.

These dispensing assemblies, however, include additional dispensing control circuitry 27 which are operably coupled to central controller device 20 to control the output of the impinging stream 17 in a manner optimizing cleaning efficiency. For example, the output diameter of the impinging stream 17 may be controlled by adjusting the dispensing nozzle 25 which in turn would control the contact area and the pressure of the impinging stream upon the substrate surface.

Accordingly, in situations where smaller contaminant particles require removal, the dispensing nozzle 25 may be adjusted to output a smaller diameter impinging stream, having a diameter of about 0.15 mm with a gas/fluid control pressure of about 70 psig for more localized cleansing.

Hence, only the immediate area surrounding the contaminant particle will be contacted in full force by the impinging stream to minimize the potential cleaning induced damage and to provide adequate strong aerosol pressure for contaminant particle removal. In addition, the diameter of the dispensing nozzle exit opening should be adequately small so that there is sufficient expanding of the substance to a lower pressure so that at least a substantial portion of the substance solidifies due to Joule-Thompson cooling of the substance for production of aerosol. In other situations where a cluster of or a larger contaminant particle may require removal from the substrate surface, the dispensing nozzle 25 may be adjusted to output a larger diameter impinging stream, having a diameter of about 2 mm for a gas/fluid control pressure of about 90 psig, so as to provide a greater diameter contact area. This will assure a greater probability of removing the contaminant particles, as well as enable more coverage by the impinging stream in less amount of time.

Moreover, dispensing control circuitry 27 of cleaning assembly 10 further controls the pressure of the impinging stream in order to optimize cleaning efficiency relative the estimated size of the contaminant particle. As set forth above, the smaller contaminant particles are more difficult to remove due to their smaller surface area, as well as their increased adhesion force relative to the diameter of the particle. Accordingly, the output pressure of the impinging stream can be customized to desired contaminant particle designated for removal.

The dispensing control circuitry 27 may also control the relative movement of the dispensing nozzle 25 for positioning of the contaminant particle in the path 18 of the impinging stream. Similar to the relative movement of the substrate holder 23, such relative movement of the dispensing nozzle would be computer operated through conventional control devices.

These mechanisms may also adjust the angle of impingement by the stream against the contaminant substance and substrate surface to optimize localized removal. The preferred angle of impingement is between about 0° to about 90°, and more preferably about 45°. Moreover, the delivery of the impinging stream may be pulsated to further facilitate localized removal of the contaminant substance.

From the above description of the present apparatus, it will be understood that a method of the present invention is provided for removing contaminant substances 11, 11' from surface 12 of substrate 13 for microelectronics fabrication. As shown in FIG. 3, the contaminant removal method includes the steps of: providing a substrate (29); and locating (30) at least one contaminant substance positioned on the surface 12 of the substrate 13; and dispensing (31) a cleaning agent in a substantially accurate and controlled impinging stream 17 along a path 18. The next step includes positioning (32) one of the impinging stream and the at least one contaminant substance in the path of the impinging stream 17 to enable substantially precise, localized impingement and removal of the contaminant substance 11' from the substrate surface 12.

It will be appreciated that the dispensing step 31 and the positioning step 32 may be in any order as shown in FIG. 3. Preferably, however, the substrate and dispensing assembly are aligned before the dispensing step commences.

The locating step includes the steps of: reading a particle map (33) of the surface 12 of the substrate 13 to detect the contaminant substance 11', and mapping the location (34) of the contaminant substance relative the surface of the substrate.

The locating and mapping steps (33, 34) further include the steps of locating and mapping substantially all contaminant substances 11, 11' on the surface of the substrate; and the positioning step 32 further includes the step of selectively positioning at least one selected contaminant substance in the path of the impinging stream to enable substantially precise, localized impingement of the immediate surrounding area of the contaminant substance for removal thereof from the surface.

In another aspect of the present invention method, the locating and mapping steps (33, 34) the step of estimating the relative size and dimension of each detected contaminant substance. Based upon this information, the method further includes the step of adjusting the impinging stream in a manner enabling removal of the selected contaminant substance from the substrate surface 12.

The adjusting step is performed by adjusting the pressure of the gaseous stream from the dispensing apparatus 16 against the respective contaminant substance. This gaseous stream pressure is preferably in the range of between about 20 psig to about 690 psig. The adjusting step may also be performed by adjusting the output diameter of the impinging stream, either alone or in combination with the velocity and/or pressure adjustment. The output diameter is preferably in the range of between about 0.15 mm to about 2 mm. Finally, the adjusting step may be performed by pulsating the impinging stream.

While the invention has been particularly shown and described with reference to various embodiments, it will be recognized by those skilled in the art that modifications and changes may be made to the present invention without departing from its scope. The scope of the invention should therefore be determined not with reference to the above description but with reference to the appended claims along with their full scope of equivalents.

What is claimed is:

1. A substrate cleaning assembly for removing contaminant substances from a surface of a substrate employed in microelectronics manufacturing comprising:
   a substance locator adapted to locate and map at least one contaminant substance on the surface of the substrate;
   a dispenser formed and dimensioned to dispense a substantially controlled, impinging stream of a cleaning agent along a path; and
   a controller coupled to said substance locator and said dispenser, and adapted to control said impinging stream such that the located contaminant substance is positioned in the path of said impinging stream to enable substantially localized impingement and removal of said contaminant substance from said surface.

2. The substrate cleaning assembly as defined in claim 1 wherein,
   said locator is adapted to determine a size of said contaminant substance.

3. The substrate cleaning assembly as defined in claim 1 further comprising a substrate holder device and wherein,
   said locator is adapted to locate, map and numerically designate coordinates to substantially all contaminant substances on the surface of said substrate; and
   said controller is adapted to selectively position one of said dispenser and said substrate holder device to move at least one contaminant substance on said surface in the path of the impinging stream for substantially localized impingement of said contaminant substance for removal thereof from said surface of said substrate.

4. The substrate cleaning assembly as defined in claim 3 wherein,
   said locator is adapted to determine a size and dimension of each of said contaminant substances; and
   said controller is coupled to an output controller of said dispenser, wherein said output controller is configured to adjust the impinging stream, based on said size and dimension of each of said contaminant substances, in a manner enabling removal of the selected contaminant substance.

5. The substrate cleaning assembly as defined in claim 4 wherein,
   said output controller includes a pressure control device to adjust a pressure of the impinging stream in a nozzle of said dispenser.

6. The substrate cleaning assembly as defined in claim 5 wherein,
   said pressure of the impinging stream is in the range of between about 20 psig to about 690 psig.

7. The substrate cleaning assembly as defined in claim 5 wherein,
   said output controller adjusts an output diameter of the impinging stream dispensed from said nozzle of said dispenser.

8. The substrate cleaning assembly as, defined in claim 7 wherein,
   said pressure of the impinging stream is in the range of between about 20 psig to about 690 psig, and said output diameter of said impinging stream is in the range of between about 0.15 mm to about 2 mm.

9. The substrate cleaning assembly as defined in claim 4 wherein,
   said output controller adjusts an output diameter of the impinging stream dispensed from a nozzle of said dispenser.

10. The substrate cleaning assembly as defined in claim 9 wherein,
    said output diameter of said impinging stream is in the range of between about 0.15 mm to about 2 mm.

11. The substrate cleaning assembly as defined in claim 4 wherein,
    said dispenser is configured to dispense an aerosol cleaning agent.

12. The substrate cleaning assembly as defined in claim 4 wherein,
    said dispenser is configured to dispense a jet stream cleaning agent.

13. The substrate cleaning assembly as defined in claim 1 wherein,
    said dispenser is configured to dispense an aerosol cleaning agent.

14. The substrate cleaning assembly as defined in claim 1 wherein,
    said dispenser is configured to dispense a jet stream cleaning agent.

15. A method of removing contaminant substances from a surface of a substrate employed in microelectronics manufacturing comprising the steps of:
    placing a substrate holder device;
    locating at least one contaminant substance positioned on and relative to the surface of the substrate;
    dispensing a cleaning agent from a dispenser in a substantially accurate and controlled impinging stream along a path;
    positioning one of the dispenser and the substrate holder device to move the at least one contaminant substance in the path of the impinging stream to enable substantially precise, localized impingement and removal of said contaminant substance from said surface of said substrate.

16. The method according to claim 15 wherein, said locating step includes the steps of:
reading a particle map of the surface of the substrate to detect the contaminant substance, and
mapping a location of the contaminant substance relative the surface of the substrate.

17. The method according to claim 16 further including the step of:

determining a size of said contaminant substance.

18. The method according to claim 16 wherein, said locating step further include the steps of locating and mapping substantially all contaminant substances on the surface of said substrate; and said positioning step further includes selectively positioning said substrate holder device to move at least one selected contaminant substance in the path of the impinging stream to enable substantially precise, localized impingement of said at least one contaminant substance for removal thereof from said surface.

19. The method according to claim 18 further includes the step of:

determining a size and dimension of each contaminant substance; and adjusting the impinging stream, based on said size and dimension of each of said contaminant substances, in a manner enabling removal of the selected contaminant substance.

20. The method according to claim 19 wherein, said adjusting step is performed by adjusting a pressure of the impinging stream depending upon said size and said dimension of said contaminant substance.

21. The method according to claim 20 wherein, said pressure of the impinging stream is in the range of between about 20 psig to about 690 psig.

22. The method according to claim 20 wherein, said adjusting step is further comprises adjusting an output diameter of the impinging stream.

23. The method according to claim 22 wherein, said pressure of the impinging stream is in the range of between about 20 psig to about 690 psig, and said output diameter is in the range of between about 0.15 to about 2 mm.

24. The method according to claim 19 wherein, said adjusting step is performed by adjusting an output diameter of the impinging stream.

25. The method according to claim 19 wherein, said adjusting step is performed by pulsating the impinging stream.

* * * * *